United States Patent [19]
Chang et al.

[11] Patent Number: 4,733,282
[45] Date of Patent: Mar. 22, 1988

[54] ONE-DIMENSIONAL QUANTUM PIPELINE TYPE CARRIER PATH SEMICONDUCTOR DEVICES

[75] Inventors: Leroy L. Chang, Goldens Bridge; Leo Esaki, Katonah, both of N.Y.

[73] Assignee: International Business Machines Corporation, Armonk, N.Y.

[21] Appl. No.: 765,403

[22] Filed: Aug. 13, 1985

[51] Int. Cl.$^4$ ............................................. H01L 27/12
[52] U.S. Cl. ............................................. 357/4; 357/16
[58] Field of Search .............................. 357/4 SL, 16

[56] References Cited
PUBLICATIONS

Japanese Journal of Applied Physics, vol. 19, No. 12, Dec., 1980, pp. L735-L738; "Scattering Suppression and High-Mobility Effect of Size-Quantized Electrons in Ultrafine Semiconductor Wire Structures", by H. Sakaki.

IBM Technical Disclosure Bulletin, vol. 27, No. 4B, Sep. 1984, p. 2592, "Edge Superlattice Bloch Oscillator", by L. L. Chang et al.

Proceedings of the 17th International Conference on the Physics of Semiconductors, San Francisco, Calif., Aug. 6-10, 1984, "Semiconductor Superlattices and Quantum Wells", by Leo Esaki, p. 473.

Primary Examiner—Martin H. Edlow
Attorney, Agent, or Firm—Alvin J. Riddles; Thomas J. Kilgannon

[57] ABSTRACT

A semiconductor superlattice is provided with a one-dimensional quantum pipeline type carrier path. The pipeline is formed at the intersection of different energy level layers of the superlattice. Conductivity modulation through an adjacent exposed surface is employed for control in the pipeline and in arrays thereof. The pipeline carrier path involves both electrons and holes. A structure of $Ga_{1-x}Al_xAs$ with alternating 100Å and 500Å thick layers of different x has positioned, intersecting those layers, a 100Å thick GaAs layer covered by a GaAlAs layer. Control and contacting electrodes are positioned on the exposed surfaces.

9 Claims, 6 Drawing Figures

ONE-DIMENSIONAL QUANTUM PIPELINE TYPE CARRIER PATH SEMICONDUCTOR DEVICES

The government has rights in this invention pursuant to Contract No. DAAG 29-81-C-0038 awarded by the U.S. Army Research Office.

DESCRIPTION

TECHNICAL FIELD

The technical field of the invention is in semiconductor devices in which losses due to carrier scattering are reduced.

BACKGROUND ART

The efforts controlling scattering losses have been effective in the structure known as a superlattice, made up of a line of thin epitaxial regions of semiconductors with different properties, wherein the width dimension of regions in the superlattice is reduced to less than the electron mean free path and the carrier transport in certain directions is restricted.

As the art has developed, a variety of engineered structures have exhibited extraordinary transport and optical properties. A goal in semiconductor superlattices is to produce a structure in which the dimensionality of carrier movement is reduced.

The development of the superlattice art and a description of the goals that the superlattices are to achieve is described in "Semiconductor Superlattices and Quantum Wells" by Leo Esaki published in the Proceedings of the 17th International Conference on the Physics of Semiconductors, San Francisco, Calif., Aug. 6–10, 1984, beginning on page 473.

There have been two structures in the art in which an effort has been made to use a superlattice to provide single dimensional carrier movement. Both structures use an inversion layer adjacent an interface for confinement in one direction and a superlattice region thickness for confinement in a second direction leaving freedom of carrier movement in the third direction. The first is in the Japanese Journal of Applied Physics, Vol. 19, No. 12, December 1980, pp. L735–L738 wherein, a V shaped structure gate in a GaAs/GaAlAs superlattice produces an inversion layer in an intermediate region of the superlattice adjacent the gate. The second is in the IBM Technical Disclosure Bulletin Vol. 27, No. 4B, September 1984, p. 2592 in which an inversion layer adjacent an interface across a plurality of superlattice regions provides oscillator performance.

DISCLOSURE OF THE INVENTION

A semiconductor device in which carrier movement is confined to a one-dimensional quantum pipeline is achieved in a superlattice in which the series of regions are of different widths, progress in more than one direction and are proximate to a control surface.

With the multidirectional superlattice of the invention semiconductor device capabilities become available through the unique physical properties that occur due to proximity of surfaces and at intersections of low energy level internal regions.

The quantum pipeline one-dimensional carrier path of the invention is formed in the multidirectional superlattice structure at an intersection of low energy level layers and control of carrier performance is achieved by conductivity modulation in the pipeline and in arrays thereof, by signals applied through an adjacent surface which affects carrier population in the pipeline.

Further, in accordance with the invention, the confinement principle produces a pipeline carrier path having either electrons or holes or both.

Control and response to signals is provided by applying to a surface of the superlattice a conductor that is in current influencing proximity to the pipeline.

In transport type devices, such as transistors, there is achieved through the invention increased speed through directionality and through high mobility, and, increased density through ultrafine dimensions. In optical type semiconductor devices such as optical detectors and light emitting devices including lasers through the invention because both electrons and holes coexist under identical complementary conditions, there will be strong optical coupling due to the large joint density of states and large exciton binding energies.

In accordance with the invention, the energy levels of the crystal structure confine carriers to a quantum pipe restricting motion in both the Z and Y directions so that motion is free only in the X direction.

In accordance with the invention, a semiconductor monocrystal is provided having superlattice structural features in more than one direction and a control element surface in current influencing proximity. Such a structure has unique physical properties that occur due to intersections of internal superlattice regions and due to the proximity of surfaces. While the multidirectional superlattice of the invention will be described for clarity in two dimensions in connection with the quantum pipeline single dimension carrier path of the invention it will be apparent to one skilled in the art in the light of the general parameters of physics described that there will be many extensions and substitutions in application of the principle.

Figure 1:
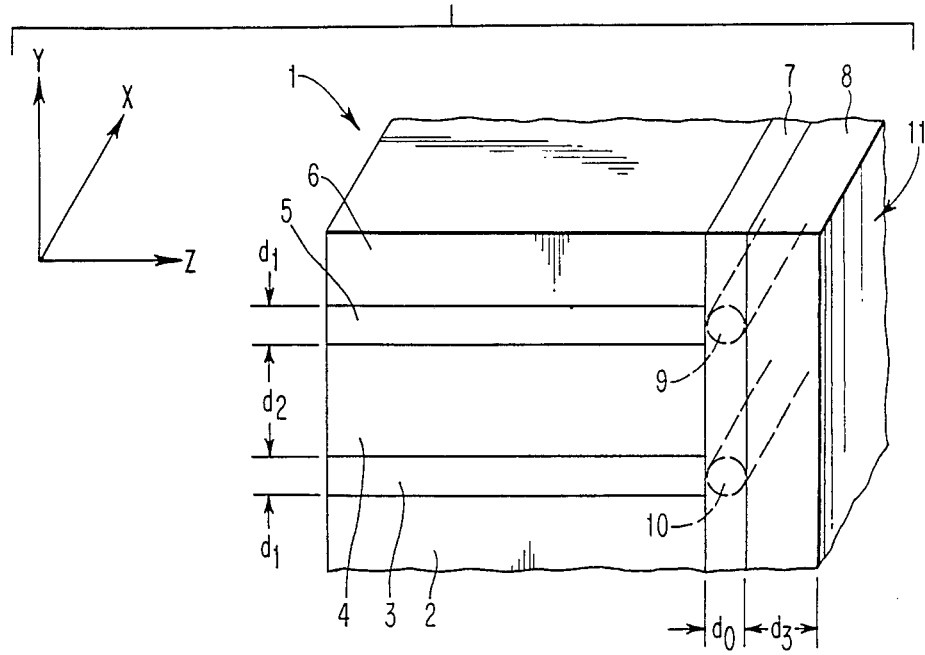
FIG. 1 is a schematic view of a semiconductor superlattice crystal illustrating the one-dimensional quantum pipeline type carrier path of the invention.

Referring to FIG. 1, a schematic view is provided showing the multidirectional superlattice crystal with the control element surface, and illustrating the quantum pipeline, single dimensional carrier path, of the invention.

In the superlattice 1, in one crystallographic direction there are layers of semiconductor material having different energy gaps and dimensions in relation to each. Five layers are shown to illustrate the principle. The layers having a larger energy gap 2, 4 and 6 also have a larger thickness dimension $d_2$ and the layers with a smaller energy gap 3 and 5 also have a smaller thickness dimension $d_1$.

In FIG. 1 an orientation figure for the X, Y and Z axes is shown. In the multidirectional superlattice crystal 1 there are layers in the XZ plane of elements 2, 3, 4, 5 and 6 with their thickness being in the Y direction.

In the Z direction on a surface of the layers 2, 3, 4, 5 and 6, a smallest energy gap semiconductor layer 7 having a width $d_0$ is provided. Continuing in the Z direction, a region with a larger energy gap labelled element 8, with a thickness $d_3$ is provided. The exposed surface 11 of layer 8 or any subsequent layers is within current influencing proximity to layer 7.

In the resulting structure, at the intersection of the smaller band gap lower energy level layers 3 and 5 in one crystallographic direction in the multidirectional superlattice that intersect with an even smaller band gap still lower energy level layer 7 of the regions 7 and 8 in a different crystallographic direction, the energy conditions will be such that carriers, both electrons and holes, will be confined in the Y and in the Z directions but will be free only in the X direction. Thus, a one-dimensional quantum pipeline type carrier path is formed at that intersection. An example of two pipelines are shown in FIG. 1, the first is labelled 9 at the intersection of layers 5 and 7 and the second is labelled 10 at the intersection of layers 3 and 7.

The availability of the control element surface in current influencing proximity in the multidirectional superlattice of the invention provides control.

Referring again to FIG. 1, the carriers in the pipeline can be populated or depopulated and motion in the X direction can be controlled by an externally applied signal along the control element surface 11 which is in current influencing proximity.

The structure of FIG. 1 may be fabricated of $Ga_{1-x_1}Al_{x_1}As$ with a thickness of $d_1$ and $Ga_{1-x_2}Al_{x_2}As$ with a thickness of $d_2$ where $x_2 > x_1$ in the Y direction. A group unit in a crystallographic direction of the epitaxial layers 2, 3, 4, 5 and 6, would be cut, polished and etched, with particular attention to providing a growth interface at the XY plane where a layer 7 of GaAs is grown to a thickness of $d_0$ and thereon a layer 8 of $Ga_{1-x_3}Al_{x_3}As$ having a thickness $d_3$ and where $x_3$ is at least equal to $x_2$, is grown on the GaAs layer 7. Current influencing proximity of a control element on the surface 11 is affected by the thickness $d_3$.

The carriers provided in the pipelines 9 and 10 may be achieved by direct doping or by modulation doping. Where direct doping is employed signals applied through surface 11 can enhance as well as deplete the carrier population in the pipeline. In the use of modulation doping, the impurity is located in element 8, but the carrier is in the adjacent pipeline in element 7.

The physical principles involved in the multidirectional superlattice and quantum pipeline carrier path of the invention are illustrated in connection with the energy diagrams of FIGS. 2, 3, 4 and 5.

Figure 2:
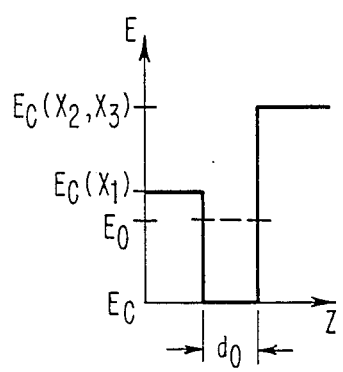
FIGS. 2, 3 and 4 are energy diagrams of the crystal of FIG. 1 in respectively the Z, the Y and the X directions.
Figure 3:
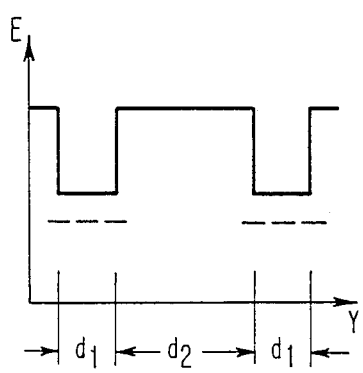
Figure 4:
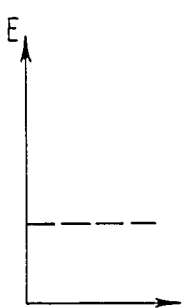

The energy confinement in the quantum carrier path pipes 9 and 10 of the invention is illustrated for each individual axis separately, respectively in connection with FIG. 2 for the Z axis, FIG. 3 for the Y axis and FIG. 4 for the X axis.

Considering FIGS. 2, 3 and 4.

Along the E or energy scale of FIGS. 2, 3 and 4, $E_c$ corresponds to the conduction band energy of the lowest energy gap material in the system, which in the illustration is the GaAs 7. $E_{c(x_1)}$ represents the conduction band energy of the conduction band of the $Ga_{1-x_1}Al_{x_1}As$ of layers 3 and 5. $E_{c(x_2,x_3)}$ represents the conduction band energy of the $Ga_{1-x_2}Al_{x_2}As$ of layers 2, 4 and 6 with $x_2$ and of the $Ga_{1-x_3}Al_{x_3}As$ of layer 8 with $x_3$.

$E_o$ is the ground state of the entire system. This state is occupied by the electrons. In each of FIGS. 2 and 3 in the horizontal or respectively the Z and Y directions, the widths of $d_0$, $d_1$ and $d_2$ are shown.

One property of the multidirectional superlattice with the proximate control surface of the invention is that at the intersection of lower energy level layers with an even lower energy level layer there will be a location where carriers can accumulate which will then require greater energy to travel in any direction other than in a selected direction. The selected direction for illustration is the X direction.

Figure 5:
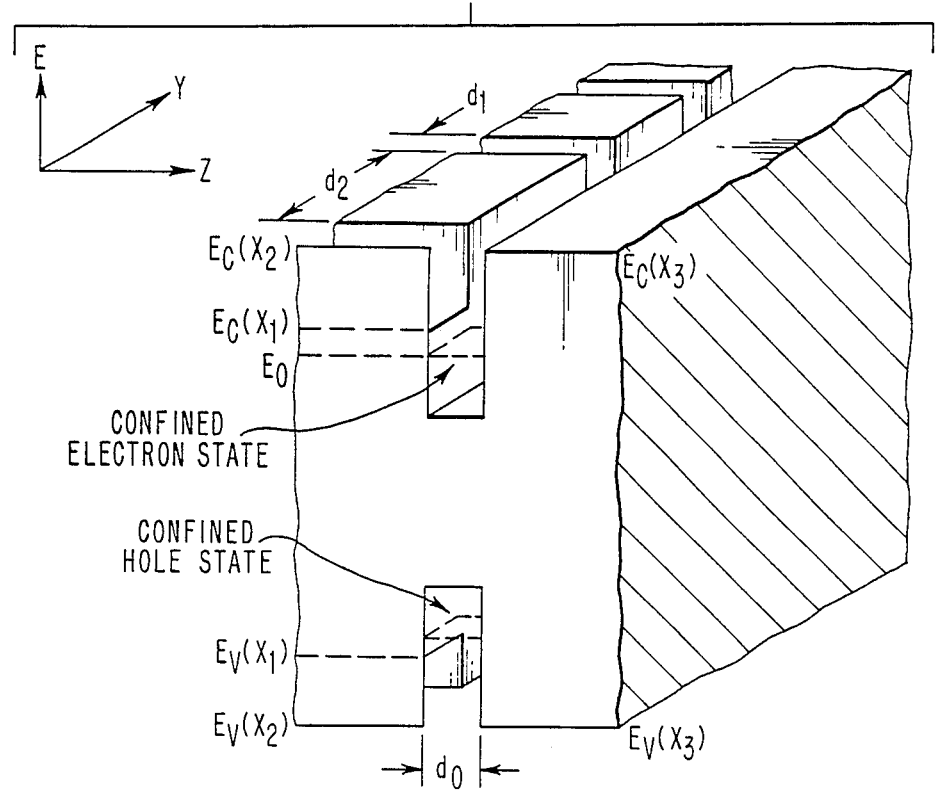
FIG. 5 is a schematic view of the energy levels in the structure of FIG. 1 in three-dimensions illustrating the confinement provided and the presence of both electrons and holes.

The physical principles of the invention are further illustrated by the combining of the three energy diagrams of FIGS. 2, 3 and 4 in their respective axial directions as shown in FIG. 5. An orientation diagram is again provided in which in this illustration the energy E is the vertical and the Y and Z planes are the horizontal. The same designations for $E_o$ and $E_c$ and for $X_1$, $X_2$ and $X_3$ as in FIGS. 2, 3 and 4 are employed. The valence band energy for the different X values of Al($X_1$, $X_2$ and $X_3$) is labelled $E_v$. The energy confining properties of the invention provide a condition in the lowest energy level layer 7 of FIG. 1 having the width $d_0$ illustrated in the energy diagram of FIG. 5 where there are symmetrical electron and hole confined states that are linearly, vertically aligned in the $d_0$ width. This property provides a unique environment where all optical transitions will involve discrete energies with enhanced exciton binding. The advanced optical properties will enhance performance in optical and electro-optical semiconductor structures.

The resulting structure may be considered to be a one-dimensional quantum well structure. It may be viewed in essence as being assembled by converting one side of the potential barrier of an asymmetric quantum well into a periodically indented potential, as shown in FIG. 5, in the differences between $E_{c(x_2)}$ and $E_{c(x_1)}$ and $E_{v(x_1\ and\ x_2)}$ across $d_2$ and $d_1$. This in turn produces both electron and hole confinement in the one-dimensional channel adjacent to the indented region of the side potential barrier.

To assure a one-dimensional electron system, as coupling between neighboring pipelines would tend to deviate a system toward two-dimensional, it is desirable to design the structure with relatively large values in differences between $x_2$ and $x_1$ and $d_2$ and $d_1$.

It will be apparent to one skilled in the art that in both FIGS. 2, 3 and 4 and in FIG. 5, that while for illustration purposes the potentials are drawn square, a space charge effect however small would have to be taken into account in solving the three-dimensional problem for $E_o$ as well as all energy schemes.

Figure 6:
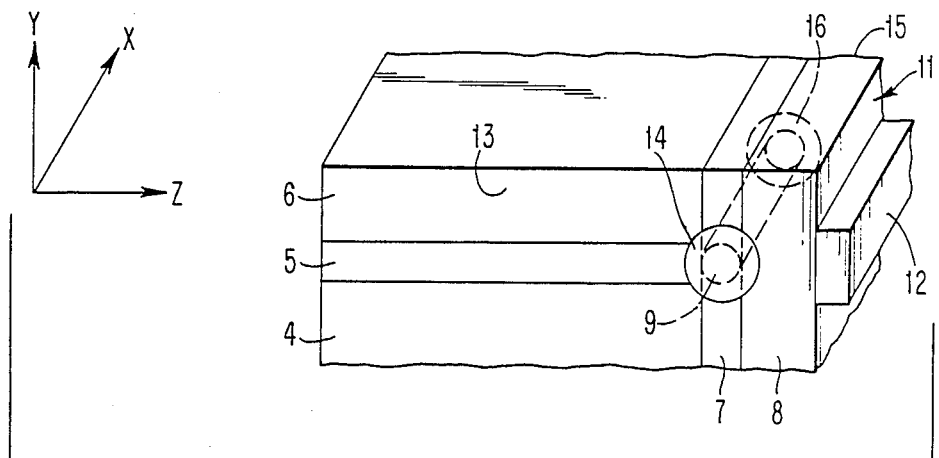
FIG. 6 is an illustration of a control element for bias and gating and device connections to the pipeline carrier path.

Referring next to FIG. 6, there is illustrated the use of the property of the control surface in the multidirectional superlattice of the invention to provide carrier control in the single dimensional quantum pipeline type carrier path of the invention, and to provide for the making of connections to the pipeline in the employing of the principles involved in fabricating a device.

On the control surface 11 an example control element conductor 12 is provided to which a signal can be applied with either polarity. The carrier population in the carrier path will be enhanced or depleted according to polarity. Conduction in the pipeline 9 can be controlled where the control element 12 is along or essentially parallel to the pipeline 9. Further, where the element 12 is constructed to cross the pipeline 9 or a series of such pipelines, in other words, the conductor 12 in FIG. 6 would then be vertical instead of horizontal as shown, combinational logic type control is achieved. While for clarity of explanation, a single pipeline and control are shown, it will be apparent to one skilled in the art in the light of the principles set forth that extensions and substitutions in number and direction can be fabricated.

Connections to the pipeline can readily be made through an adjacent surface. Through front surface 13, a standard "reach through" type high conductivity connection 14 is shown as an example and correspondingly on the back surface 15 an identical contact 16 is made again in the conventional manner to separated parts of the pipeline 9 as illustrated so that transistor action can be achieved via a signal on element 12 serving as a gate. For this type of structure, element 12 could be either parallel with the pipeline 9 or perpendicular to it.

BEST MODE FOR CARRYING OUT THE INVENTION

The structure would preferably be fabricated, referring to FIG. 1, by using a GaAs substrate and growing a GaAs buffer thereon, neither shown, followed by a series of alternate shown layers 2-6 of $Ga_{1-x}Al_xAs$ in the X-Z plane, with thickness in the Y direction. The GaAlAs would have different values of x corresponding with FIG. 1 of $x_1=0.2$, $x_2=0.4$ and thicknesses $d_2>d_1$ of the order where $d_1$ would be about 100Å and $d_2$ about 500Å.

The grown structure would be prepared for further growing on the X-Y plane and a layer 7 of GaAs having a thickness $d_0$ of 10-200Å with 50Å preferred, would be grown. Following that, there would be grown a layer 8 of GaAlAs having a concentration $x_3$ of 0.8 and a thickness $d_3$ of about 500Å. All regions would be undoped with the exception of 7 which would be either conventionally doped or modulation doped through 8. The preferred dopant would be Si to provide an electron concentration of about $10^{17}$ atoms/cc or $10^{11}$ $cm^{-2}$ sheet density.

The superlatttice structure would be grown by either molecular beam epitaxy or metal organic chemical vapor deposition as is standard in the art. Since the structure has such narrow regions, it is important not to be reckless with temperatures. For molecular beam epitaxy, it would be well not to exceed 600° C. and for metal organic chemical vapor deposition about 800° C.

The connections 14 and 16 are applied by standard ohmic contact techniques. The control members 12 are patterned in the configuration desired, and then formed by depositing Al.

Under these circumstances and at the thickness and doping used, the signal applied to the control member or gate 12 influencing conduction between contacts 14 and 16 would be of the grder of 1-10 volts. Electron concentrations of $cm^{-3}$ and mobilities greater than $10^6$ $cm^2$/volt. sec are achievable.

In summary, what has been described is a multidirectional superlattice crystal with a control surface and a quantum pipeline type single dimensional carrier path for semiconductor structures that is achieved by providing in the multidimensional superlattice intersecting lower and even lower energy level layers providing a pipeline that has electrons, holes and corresponding electrons and holes.

Having thus described our invention, what we claim as new and desire to secure by Letters Patent is:

1. A semiconductor device having a one dimension quantum pipeline type carrier path comprising
    in a semiconductor crystal body
    a region of epitaxially contiguous layers of alternating first and second energy band gap semiconductor materials, said second energy band gap being larger than said first, the width dimension for each said second higher energy band gap layer beig greater than the width dimension of each said first energy band gap layer,
    a face of said region perpendicular to said layers therein providing an internal interface in said crystal body
    a carrier path layer of a semiconductor material having a third energy band gap, said third energy band gap being smaller than said first energy band gap,
    said carrier path layer having first and second sides,
    said first side of said carrier path layer being epitaxial with said internal interface
    said carrier path layer having a width dimension perpendicular to said interface that is approximately the length of the mean free path of a carrier in said semiconductor material
    a control portion,
    said control portion having first and second surfaces
    said control portion being of a semiconductor material having a fourth energy band gap
    said fourth energy band gap being at least larger than said third energy band gap,
    said first surface of said control portion being epitaxial with said second side of said carrier path layer,
    said second surface of said control portion being separated from said first surface of said control portion by a dimension operable to permit current influencing signal responsiveness to current in said carrier layer by signals applied through said control portion
    at least one set of first and second ohmic electrodes of said carrier path layer positioned at separated carrier path length locations at at least one intersection of said carrier path layer and one said first band gap layer of said region and,
    at least one current control electrode positioned on said second side of said control portion in current influencing proximity to the portion of said carrier path layer between each said set of ohmic electrodes.

2. The device of claim 1 wherein the layers of said region are of $Ga_{1-x}Al_xAs$ where x is greater for said second band gap and said carrier path layer is of GaAs.

3. The device of claim 2 wherein the width of the layers with said first band gap is approximately 100 Angstroms.

4. The device of claim 3 wherein the width dimension of said control portion is approximately 500 Angstroms.

5. A semiconductor device having a one dimension quantum pipeline type carrier path comprising,
    in a semiconductor crystal body
    a carrier path layer of a semiconductor material
    said carrier path layer having first and second sides,
    said carrier path layer having a width dimension that is approximately the mean free path length of a carrier in said carrier path semiconductor material
    said carrier path layer having a first energy band gap value,
    a region of said semiconductor crystal body positioned epitaxially contiguous to said first side of said carrier path layer said region having a periodic variation of energy band gap between locations therein having a second energy band gap value larger than said first energy band gap value and locations therein having a third energy band gap value larger than said second energy band gap value said region having a larger distance between locations having said third energy band gap than locations having said second energy band gap, a control portion of a semiconductor material said control portion having first and second sides said control portion having a fourth energy band gap larger than said first energy band gap, said first side thereof being epitaxially contiguous to said carrier path layer and said sides being separated by a thickness dimension of a magnitude operable to permit control signal influence of carriers in said carrier path layer responsive to signals applied at said second side electrode means for entry, removal and control of current at a carrier path in said carrier path layer.

6. The device of claim 5 wherein said control portion is made up of at least one layer with a combined thickness establishing said operability for control signal influence.

7. The device of claim 6 wherein locations having said second energy band gap are of $Ga_{1-x_1}Al_{x_1}As$ and locations having said third energy band gap are of $Ga_{1-x_2}Al_{x_2}As$ where $x_2 > x_1$, said carrier path layer is GaAs and said control portion is $Ga_{1-x_3}Al_{x_3}As$ where $x_3 \geq x_2$.

8. The device of claim 7 wherein the thickness of said $Ga_{1-x}Al_xAs$ locations and said GaAs layer is approximately 100Å.

9. The device of claim 8 wherein said $Ga_{1-x}Al_xAs$ layer is approximately 500Å thick.

* * * * *